United States Patent
Alemi

(10) Patent No.: US 10,547,275 B2
(45) Date of Patent: Jan. 28, 2020

(54) HIGH EFFICIENCY WIDE BANDWIDTH POWER AMPLIFIER

(71) Applicant: Alireza Alemi, Tehran (IR)

(72) Inventor: Alireza Alemi, Tehran (IR)

(*) Notice: Subject to any disclaimer, the term of this patent is extended or adjusted under 35 U.S.C. 154(b) by 0 days.

(21) Appl. No.: 15/859,270

(22) Filed: Dec. 29, 2017

(65) Prior Publication Data

US 2018/0123522 A1 May 3, 2018

(51) Int. Cl.
*G01R 19/00* (2006.01)
*H03F 1/18* (2006.01)
*H03F 3/60* (2006.01)
*H03F 3/217* (2006.01)
*H03F 3/21* (2006.01)

(52) U.S. Cl.
CPC ............... *H03F 1/18* (2013.01); *H03F 3/607* (2013.01); *H03F 3/211* (2013.01); *H03F 3/2178* (2013.01)

(58) Field of Classification Search
CPC .......... H03F 1/18; H03F 3/211; H03F 3/2178; H03F 3/607
USPC ....................................................... 330/2, 54
See application file for complete search history.

(56) References Cited

U.S. PATENT DOCUMENTS

2010/0289578 A1* 11/2010 Cao ................. H03F 3/24
330/251

\* cited by examiner

*Primary Examiner* — Khanh V Nguyen
*Assistant Examiner* — Khiem D Nguyen
(74) *Attorney, Agent, or Firm* — Azadeh Saidi

(57) ABSTRACT

A new method for amplifying signals having higher bandwidth, lower T.H.D., higher efficiency, smaller circuit size and lower costs in design, has been developed. A clipped signal is amplified to smaller pieces and each smaller part is amplified. Adding clipped amplified signals to each other, the main amplified signal is generated.

4 Claims, 4 Drawing Sheets

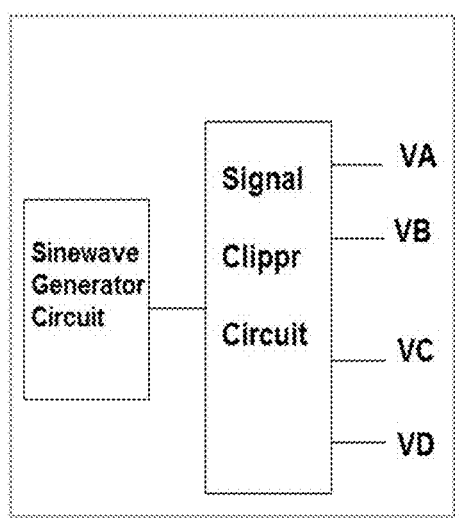 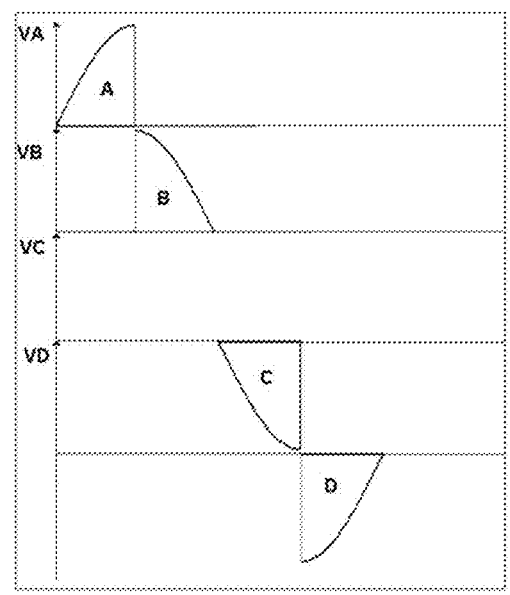
Figure 1-A
Figure 1-B

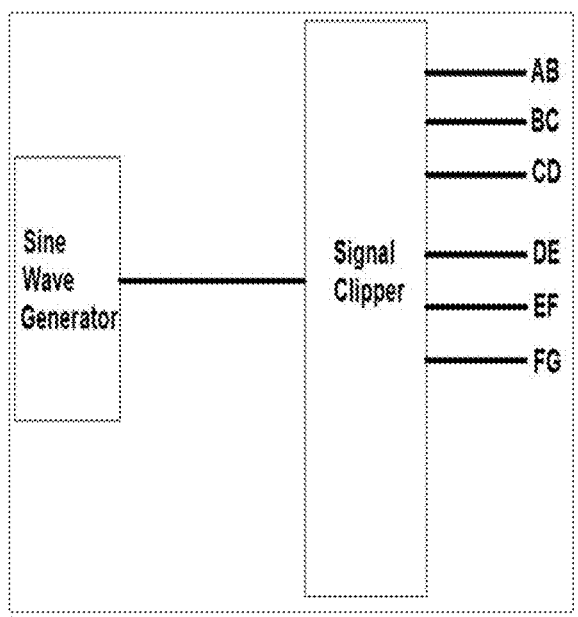 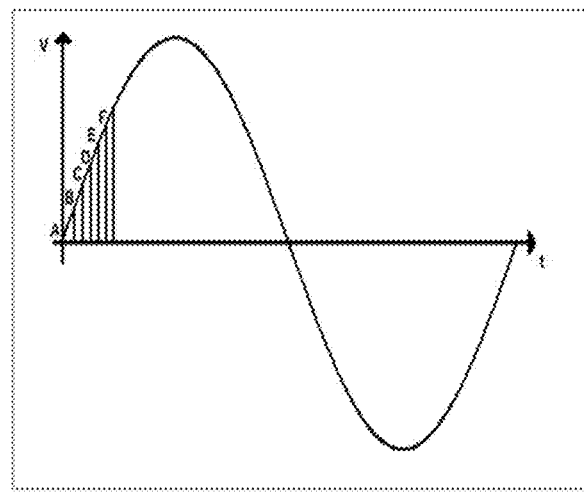
Figure 2-A
Figure 2-B

HIGH EFFICIENCY WIDE BANDWIDTH POWER AMPLIFIER

BACKGROUND OF THE INVENTION

In all previous signal amplifying methods, for low and high frequencies there are lots of disadvantages and problems such as low efficiency, large circuit size, high costs, limited bandwidth and etc. All the above mentioned disadvantages creates complexity in the design, time consuming procedure and high costs. In fact every method has its own limitations and these limitations prevent a designer not to reach the ideal point (such as high bandwidth, high efficiency, simplicity in design, smaller size . . . ). Amplifiers are categorized in different classes. Current common amplifiers work in A/B/AB/C/D/E/F classes.

BRIEF SUMMARY OF THE INVENTION

A new method for clipping a signal before amplification is disclosed. Clipped signals will be amplified separately and then they will be summed together in order to make the original input signal but with more power, which is called an output signal.

BRIEF DESCRIPTION OF SEVERAL VIEWS OF THE DRAWING(S)

FIG. 1-A illustrates a sinewave generator in which a pure sincwave is transferred into the clipping stage; wherein clipping stage clips signal into defined number of clipped signals.

FIG. 1-B illustrates clipper stages' output.

FIGS. 2-A, 2-B illustrate conception of clipping signal into more pieces if needed.

FIG. 3 illustrates a circuit that is consisted of symmetric power supply and SW1, SW2 . . . SW8. If the status of the switches is changed with special order (in accordance with input signals), the signal at the load terminals is amplified input signal.

DETAILED DESCRIPTION OF THE INVENTION

By clipping a signal and amplifying each clipped part and then adding each amplified part, we can obtain pure high amplified input signal with high efficiency, high power, lower T.H.D, lower design costs and small size. For amplifying clipped parts both linear and non-linear methods can be used. In this new method, we exploit spontaneous power of transistors.

For simplicity we assume that we are going to amplify a pure sine signal, and the output signal is a high power amplified input signal. According to the new method, the main signal should be clipped into a certain number of specific parts. For example we clipped the main signal into 4 equal parts. Like Figures A and B, we amplify each part, and then by adding each amplified clipped signals, we obtain amplified pure sinewave as the output signal. By clipping the signal into more pieces (referring to Figures A and B), for example, clipping every half cycle into four equal parts, we have eight equal parts.

Figure 3:
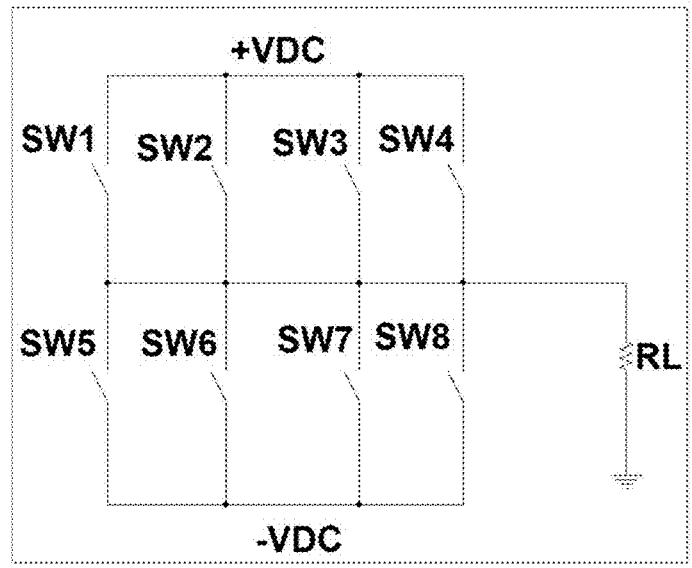

For amplifying each part, there are two common ways:
Linear method
Non-linear method
Each of both methods has their own advantages and disadvantages. Each method is explained below:
Linear Method:

Considering the fact that all transistors in FIG. 3 are linear, the signal at the load terminals are exactly pure sinewave and high power amplified (for better understanding assume every transistor is similar to variable resistors which can range from fraction of an ohm to several hundred mega ohms). The final amplified sinewave is illustrated in FIG. 4 and FIG. 5 (in FIG. 4 transistors are BIT and in FIG. 5 transistors are MOSFET).

Figure 4:
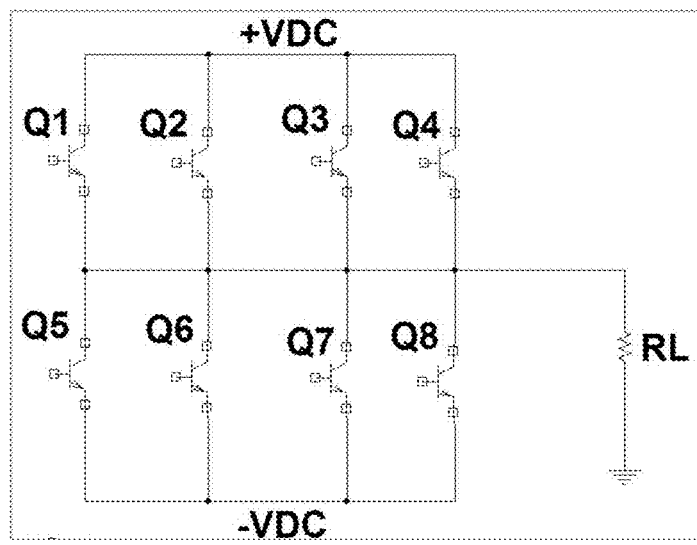
FIG. 4 is similar to FIG. 3, except instead of mechanical switches, BJT transistors were replaced.
Figure 5:
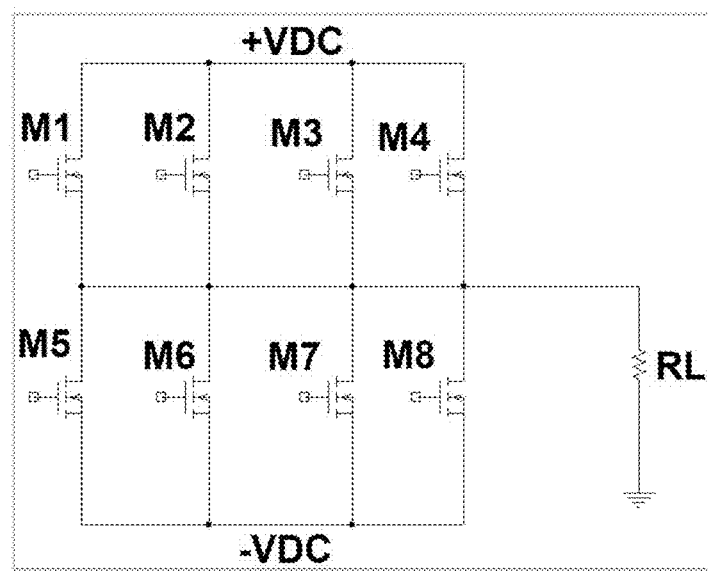
FIG. 5 is similar to FIG. 4; except instead of BJT transistors, MOSFET transistors were replaced.

Analysis of FIG. 4 and FIG. 5:

Each of Q1, Q2, Q3 and Q4 transistors work in clipped positive half cycle (each of them works ma quarter of positive half cycle).

Each of Q5, Q6, Q7 and Q8 transistors work in clipped negative half cycle (each of them works in a quarter of negative half cycle).

As a result, the terminal load signal, is a summation of 8 amplified signals in which collectively makes high power amplified pure sine wave. Performances of both circuits in linear region in FIG. 4 and FIG. 5 are the same and with approximations, analysis for each of them is similar. Also circuits in FIG. 4 and FIG. 5 can work in both switching region and linear region.

If you are about to amplify clipped signal by switching method, circuit in FIG. 5 has some advantages in contrast with circuit in FIG. 4, because MOSFETs have very small $Rds_{(on)}$, so if used as a switch, the loss will be decreased considerably versus BJTs. Also MOSFETs don't need high continuous current at the gate, while BJTs high current at the base.

Transistors Performance Analysis in Switching Region

If the transistors working in the linear mode, work in the switching mode, for generating the sinewave, the power source should follow the switches and vary similar to our arbitrary wave, or we need to generate SPWM signal. Also every SPWM cycle should be clipped and then applied to the switches. Even a square wave signal with a constant duty cycle is generated and then can be clipped and amplified, after amplifying it is simply converted in to a sine wave. However in the applications that we need sinewave with variant frequencies, the best choice is using SPWM (like amplifying voice).

The efficiency for amplifying clipped signals in the switching mode is higher than linear mode (for better understanding you can imagine that a transistor can be replaced by variant resistor in linear mode, and as a switch in saturated mode).

Each transistor has a short performance in every cycle, so if any problem occurs in a cycle, it can only affect a small part of it not the whole cycle. As well, if transistors heat up during their performance, they will have enough time for cooling in the rest of the cycle. Because of the short performance in each cycle; transistors could be used with permitted spontaneous current which is much higher than permitted continuous current. Using transistors in this current can lower the costs and therefore cheaper transistors.

In amplifying, if we use a transistor in the whole cycle or half cycle, it will be heated up and consequently, by increasing the resistance of the conductance the loss will increase. But in this new method, transistors have enough time for cooling and never heat up, so the efficiency in this method is higher. High power and high frequency transistors are very expensive, using this method let us to use low frequency transistors in which they are much cheaper. As well as this, in power electronic, it is possible to manufacture transistors that tolerate much higher instantaneous current, in this case the size of transistors could be much smaller. Because of lower $Rds_{on}$, impedance matching is easier, and so it is another advantage for this method. Implementing this method into an integrated circuit is convenient, if this happens, in the future we will witness amplifying integrated circuit with high bandwidth, high power, high efficiency and low costs.

Below equation describes loss equation in each transistor for clipped signal in switching mode amplification.

$$P_{Loss}=1/T\int_0^{T/n}[V_{switch(sat)} \times I_{switch(max)}]$$

In this formula 'n' represents number of switches (in fact it represents the number of clips in each signal) and T represents the time.

$V_{sat}$ represents switch terminals' voltage when it is fully on. $I_{switch}$ shows maximum switch current when it is fully on. Total circuit losses (whole transistors' loss):

$$P_{DT}=\Sigma_{m=1}^{\infty}(P_{LOSS})_m$$

In the above equation 'm' represents the number of switches.

As much as the number of the signal clips increases, efficiency will be improved and T.H.D will be decreased.

Approximate efficiency equation is:

$$\text{Efficiency} = \frac{Po_{ac(max)}}{Po_{ac(max)} + \left[\frac{1}{T}\int_0^{\frac{T}{n}}[V_{Switch(sat)} \times I_{Switch(max)}]dt\right]}$$

The above mentioned equation is for each transistor in which instead of integral equation you can replace below series to obtain overall efficiency:

$$\text{Efficiency}_{total} = \frac{Po_{ac(max)}}{Po_{ac(max)} + \left[\sum_{m=1}^{\infty}(P_{loss})_m\right]}$$

INDUSTRIAL APPLICATIONS

This new method has a very high potential for applying in the industry and in the industrial process. Some of these applications are listed below:

Coast to sea navigation transmitters
Sea to sea navigation transmitters
Land to land navigation transmitters
Land to space and space to land transmitters
Broadcasting transmitters
Audio amplifiers
Induction heating and more.

In FIG. 4, the performance of the BIT transistors are similar to the mechanical switches but the only difference is that, BJT transistors can work in both linear region and switching region.

In FIG. 5, in some cases using MOSFETs has a better characteristic in comparison to BJT transistors.

In the end, the current invention comprises high efficiency and could reach up to 99%. The method has high Bandwidth. The slope of the bandwidth for this new method is equal to 1. In other words from zero frequency (DC) to cutoff frequency of switches it can amplifies signals in high powers. It has low T.H.D.; wherein the total harmonic distortion can reach below 0.1. It has a compact design, in contrast with other previous methods this method has high potential to result in designing high power amplifiers up to several hundred watts, of course, with smaller size and lower costs.

The invention claimed is:

1. A new method of amplifying a signal comprising steps of:
    A) clipping an input signal into a number of predetermined equal clipped parts via a signal clipper;
    B) amplifying each of said equal clipped parts via a single linear or non-linear wide-band amplifier; wherein in said single linear amplifier said signal clipper comprises multiple BJT transistors or MOFSET transistors, wherein half of said BJT/MOFSET transistors work in a quarter of positive half cycles and the remaining of said BJT/MOFSET transistors work in a quarter of negative half cycles; and wherein said number of predetermined equal clipped parts equals a number of said multiple BJT or MOSFET transistors;
    C) adding each of said amplified equal clipped parts; and
    D) obtaining a high power amplified pure output signal; wherein no filter is applied during the steps of A through D.

2. A new method of amplifying a signal comprising steps of:
    A) feeding an input signal into a signal clipper; wherein said signal clipper comprises multiple switches having multiple transistors and wherein said input signal comprises a SPWM signal (Sinusoidal Pulse Width Modulation);
    B) clipping every cycle of said SPWM signal into a predetermined number of clipped parts; wherein said number of predetermined equal clipped parts equals a number of said multiple transistors;
    C) delivering each one of said clipped parts to a single wide-band amplifier; wherein said amplifier comprises multiple switches;
    D) amplifying each of said clipped parts;
    E) adding an output signal for each of said amplified clipped parts; and
    F) summing all of the added output signals and obtaining a pure high amplified final output signal; wherein no filter is used in the above A-F steps.

3. The new method of claim 2, wherein a power loss in each of said multiple transistors for each of said clipped signals is calculated by:

$$P_{loss} = \frac{1}{T}\int_0^{\frac{T}{n}}[V_{Switch(sat)} \times I_{Switch(max)}]dt;$$

wherein "n" is a number of said switches and therefore the number of said clipped parts; and T represents said input signal time; $V_{sat}$ represents a voltage at a terminal of each one of said multiple switches when turned on; and wherein $I_{switch}$ is maximum current of each one of said multiple switches when turned on.

4. The new method of claim 3, wherein an efficiency of each one of said multiple transistors of each one of said multiple switches is calculated by:

$$\text{Efficiency} = \frac{Po_{ac(max)}}{Po_{ac(max)} + \left[\frac{1}{T}\int_0^{\frac{T}{n}}[V_{Switch(sat)} \times I_{Switch(max)}]dt\right]}.$$

* * * * *